United States Patent
Kim et al.

(10) Patent No.: US 12,238,949 B2
(45) Date of Patent: Feb. 25, 2025

(54) METHOD OF PREPARING LIGHT-EMITTING MATERIAL, LIGHT-EMITTING MATERIAL PREPARED BY METHOD, AND LIGHT-EMITTING DEVICE INCLUDING LIGHT-EMITTING MATERIAL

(71) Applicants: Samsung Electronics Co., Ltd., Suwon-si (KR); Research & Business Foundation SUNGKYUNKWAN UNIVERSITY, Suwon-si (KR)

(72) Inventors: YongChurl Kim, Seoul (KR); Nam-Gyu Park, Suwon-si (KR)

(73) Assignees: SAMSUNG ELECTRONICS CO., LTD., Gyeonggi-Do (KR); RESEARCH & BUSINESS FOUNDATION SUNGKYUNKWAN UNIVERSITY, Gyeonggi-Do (KR)

( * ) Notice: Subject to any disclaimer, the term of this patent is extended or adjusted under 35 U.S.C. 154(b) by 659 days.

(21) Appl. No.: 17/329,664

(22) Filed: May 25, 2021

(65) Prior Publication Data
US 2022/0102634 A1  Mar. 31, 2022

(30) Foreign Application Priority Data
Sep. 28, 2020 (KR) .................... 10-2020-0126372

(51) Int. Cl.
*H10K 50/115* (2023.01)
*C01G 19/00* (2006.01)
(Continued)

(52) U.S. Cl.
CPC .......... *H10K 50/115* (2023.02); *C09K 11/665* (2013.01); *H10K 50/15* (2023.02);
(Continued)

(58) Field of Classification Search
CPC .... C09K 11/665; H10K 50/115; H10K 50/15; H10K 50/16; C01P 2022/34; C01G 19/006; C01G 21/006
See application file for complete search history.

(56) References Cited

U.S. PATENT DOCUMENTS

| | | | |
|---|---|---|---|
| 10,153,407 B2 | 12/2018 | Zhang et al. | |
| 2004/0023010 A1* | 2/2004 | Bulovic | C09K 11/62 428/209 |

(Continued)

FOREIGN PATENT DOCUMENTS

| | | | |
|---|---|---|---|
| CN | 105384188 | * | 3/2016 |
| CN | 106938855 | * | 7/2017 |

(Continued)

OTHER PUBLICATIONS

Fei Cao, et al., Shining Emitter in Stable Host: Design Halide Perovskite Scintillators for X-Ray Imaging from Commercial Concept, ACS Nano, Nov. 27, 2019, 32 pp.

(Continued)

*Primary Examiner* — C Melissa Koslow
(74) *Attorney, Agent, or Firm* — CANTOR COLBURN LLP

(57) ABSTRACT

A method of preparing a light-emitting material, the method including mixing a first precursor solution including a first precursor and a first solvent with a second precursor solution including a second precursor and a second solvent to form a precipitate, and separating the precipitate to obtain a light-emitting material, wherein a solubility of the first precursor in the first solvent may be greater than a solubility of the first precursor in the second solvent, and a solubility of the second precursor in the second solvent may be greater than a solubility of the second precursor in the first solvent. A light-emitting material prepared by the method, and a (Continued)

light-emitting device including the light-emitting material is also described.

15 Claims, 8 Drawing Sheets

(51) Int. Cl.
    *C01G 21/00*     (2006.01)
    *C09K 11/66*     (2006.01)
    *H10K 50/15*     (2023.01)
    *H10K 50/16*     (2023.01)

(52) U.S. Cl.
    CPC ........... *H10K 50/16* (2023.02); *C01G 19/006* (2013.01); *C01G 21/006* (2013.01); *C01P 2002/34* (2013.01)

(56) References Cited

U.S. PATENT DOCUMENTS

| | | | |
|---|---|---|---|
| 2018/0194786 A1 | 7/2018 | Choi et al. | |
| 2018/0208840 A1* | 7/2018 | Lüchinger | C09D 11/50 |
| 2020/0013976 A1* | 1/2020 | Zhong | H10K 71/00 |
| 2020/0168763 A1* | 5/2020 | Min | H01L 33/26 |
| 2022/0194969 A1 | 6/2022 | Lee et al. | |

FOREIGN PATENT DOCUMENTS

| | | | | |
|---|---|---|---|---|
| CN | 110205118 A | 9/2019 | | |
| CN | 110589878 A | 12/2019 | | |
| CN | 110902713 A | 3/2020 | | |
| EP | 3168278 A1 | 5/2017 | | |
| EP | 3168278 B1 | 8/2018 | | |
| KR | 20200074897 A | 6/2020 | | |
| WO | WO-2018037387 A1 * | 3/2018 | ........... | C01G 21/006 |
| WO | WO-2020081696 A1 * | 4/2020 | ........... | C01G 21/006 |

OTHER PUBLICATIONS

H. Zhang et al., Pure Zero-dimensional Cs4PbBr6 Single CrystalRhombohedral Microdisks with High Luminescence and Stability, Phys.Chem.Chem.Phys. 2017, 19, 29092-102.
I. Dursun et al., CsPb2Br5 Single Crystals Synthesis and Characterization, ChemSusChem, 2017, 10, 3746-3749.
Office Action issued Nov. 1, 2024 of KR Patent Application No. 10-2020-0126372.

* cited by examiner

METHOD OF PREPARING LIGHT-EMITTING MATERIAL, LIGHT-EMITTING MATERIAL PREPARED BY METHOD, AND LIGHT-EMITTING DEVICE INCLUDING LIGHT-EMITTING MATERIAL

CROSS-REFERENCE TO RELATED APPLICATION

This application claims priority to Korean Patent Application No. 10-2020-0126372, filed on Sep. 28, 2020, in the Korean Intellectual Property Office, and all the benefits accruing therefrom under 35 U.S.C. § 119, the disclosure of which is incorporated herein by reference in its entirety.

BACKGROUND

1. Field

A method of preparing a light-emitting material, a light-emitting material prepared by the method, and a light-emitting device including the light-emitting material.

2. Description of Related Art

Light-emitting devices are devices that convert electrical energy into light energy. Typical light-emitting devices include an anode, a cathode, and an emission layer positioned between the anode and the cathode. Additionally, a hole transport region may be between the anode and the emission layer, and an electron transport region may be between the emission layer and the cathode. Holes provided from the anode move toward the emission layer through the hole transport region, and electrons provided from the cathode move toward the emission layer through the electron transport region. The holes and the electrons recombine in the emission layer to produce excitons. These excitons transit from an excited state to a ground state, thereby generating light.

SUMMARY

One or more embodiments include a method of preparing a light-emitting material, a light-emitting material prepared by the method, and a light-emitting device including the light-emitting material. One or more embodiments include a method of preparing a light-emitting material that is efficient and capable of mass production of the light-emitting material, a light-emitting material prepared by the method, and a light-emitting device including the light-emitting material.

Additional aspects will be set forth in part in the description which follows and, in part, will be apparent from the description, or may be learned by practice of the presented embodiments of the disclosure.

According to one or more embodiments, a method of preparing a light-emitting material may include mixing a first precursor solution including a first precursor and a first solvent with a second precursor solution including a second precursor and a second solvent to form a precipitate, and separating the precipitate to obtain the light-emitting material, wherein a solubility of the first precursor in the first solvent may be greater than a solubility of the first precursor in the second solvent, and a solubility of the second precursor in the second solvent may be greater than a solubility of the second precursor in the first solvent.

According to one or more embodiments, 1 gram (g) or more of the first precursor may be dissolved at a temperature of 25° C. under 1 atmosphere, based on 100 g of the first solvent, and 1 g or more of the second precursor may be dissolved at a temperature of 25° C. under 1 atmosphere, based on 100 g of the second solvent.

According to one or more embodiments, a concentration of the first precursor solution may be 1 molar (M) or greater at a temperature of 25° C. under 1 atmosphere, and a concentration of the second precursor solution may be 1 M or greater at a temperature of 80° C. under 1 atmosphere.

According to one or more embodiments, the first solvent may include water, and the second solvent may include hexamethyl phosphoramide (HMPA).

According to one or more embodiments, each of the first precursor solution or the second precursor solution may not include an acid or a base.

According to one or more embodiments, the first precursor may include a compound represented by Formula 1, and the second precursor may include a compound represented by Formula 2:

$$A^1X^1 \quad \text{Formula 1}$$

$$B^2(X^2)_2 \quad \text{Formula 2}$$

wherein, in Formulae 1 and 2,
$A^1$ may be an alkali metal,
$B^2$ may be Pb or Sn, and
$X^1$ and each $X^2$ are independently a halogen.

According to one or more embodiments, $A^1$ may be Cs, $B^2$ may be Pb, and $X^1$ and each $X^2$ may be Cl, Br, or I.

According to one or more embodiments, the first precursor may include CsCl, CsBr, or a combination thereof, and the second precursor may include $PbCl_2$, $PbBr_2$, or a combination thereof.

According to one or more embodiments, the first precursor may further include CsI, and the second precursor may further include $PbI_2$, or the first precursor may further include CsI, and the second precursor may further include $PbI_2$.

According to one or more embodiments, a molar ratio of the first precursor:second precursor may be in a range of about 0.5:1 to about 5.0:1.

According to one or more embodiments, 0.1 grams (g) or less of the light-emitting material may be dissolved at a temperature of 25° C. under 1 atmosphere, based on 100 g of the first solvent, and 0.1 g or less of the light-emitting material may be dissolved at a temperature of 25° C. under 1 atmosphere, based on 100 g of the first solvent.

According to one or more embodiments, the light-emitting material may include a compound represented by a one of Formulae 3 to 5:

$$A^3B^3X^3_3 \quad \text{Formula 3}$$

$$A^4B^4_2X^4_5 \quad \text{Formula 4}$$

$$A^5_4B^5X^5_6 \quad \text{Formula 5}$$

wherein, in Formulae 3 to 5,
$A^3$, $A^4$, and each $A^5$ may be independently be at least one alkali metal,
$B^3$, each $B^4$, and $B^5$ may be independently Pb, Sn, or a combination thereof, and
each of $X^3$, $X^4$, and $X^5$ may be independently a halogen.

According to one or more embodiments, a molar ratio of the first precursor:second precursor may be in a range of about 1:1 to about 1.5:1, and the light-emitting material may include the light-emitting compound represented by Formula 3 and the light-emitting compound represented by Formula 4, and may not include the light-emitting compound represented by Formula 5.

According to one or more embodiments, a molar ratio of the first precursor:second precursor may be in a range of about 1.5:1 to about 4.0:1, and the light-emitting material may include the light-emitting compound represented by Formula 3 and the light-emitting compound represented by Formula 5, and may not include the light-emitting compound represented by Formula 4.

According to one or more embodiments, a molar ratio of the first precursor:second precursor may be in a range of about 4.0:1 to about 5.0:1, and the light-emitting material may include the light-emitting compound represented by Formula 5, and may not include the light-emitting compound represented by Formula 3 and the light-emitting compound represented by Formula 4.

According to one or more embodiments, the method may further include providing a mixture including the light-emitting material and a third solvent onto a substrate, providing a fourth solvent onto the substrate for crystallization, and heat-treating the substrate to remove the third solvent and the fourth solvent.

According to one or more embodiments, the method may further include heat-treating a mixture including the light-emitting material and a third solvent.

According to one or more embodiments, a light-emitting material may be prepared by the method of preparing a light-emitting material described above.

According to one or more embodiments, a light-emitting device may include: a first electrode and a second electrode each having a surface opposite the other; and an emission layer positioned between the first electrode and the second electrode, wherein the emission layer includes the light-emitting material.

According to one or more embodiments, the light-emitting device may include a hole transport region between the first electrode and the emission layer and/or an electron transport region between the emission layer and the second electrode.

According to one or more embodiments, the light-emitting device may include a charge control layer between the first electrode and the emission layer and/or between the emission layer and the second electrode.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
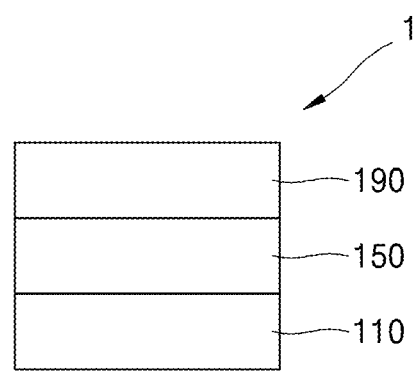
FIG. 1 is a schematic cross-sectional view of a light-emitting device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Rather, these embodiments are provided so that this disclosure will be thorough and complete, and will fully convey the scope of the invention to those skilled in the art.

As the inventive concept allows for various changes and numerous embodiments, particular embodiments will be illustrated in the drawings and described in detail in the written description. Effects, features, and a method of achieving the inventive concept will be obvious by referring to example embodiments of the inventive concept with reference to the attached drawings. The inventive concept may, however, be embodied in many different forms and should not be construed as being limited to the embodiments set forth herein.

Most of the terms used herein are general terms that have been widely used in the technical art to which the inventive concept pertains. However, some of the terms used herein may be created reflecting intentions of technicians in this art, precedents, or new technologies. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. Some of the terms used herein may be arbitrarily chosen by the present applicant. In this case, these terms are defined below. Accordingly, the specific terms used herein should be understood based on the unique meanings thereof and in the context as a whole of the inventive concept.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. The same reference numerals in the drawings refer to the same components, and the size of each component in the drawings may be exaggerated or reduced for clarity and convenience of description. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% of the stated value.

When a part such as a layer, film, area, plate, or the like is described to be "on" another part, this description is construed as including not only the case where the part is "directly on" the other part but also the case where another part is interposed therebetween. On the other hand, when a part is described to be "directly on" another part, this description is construed as that no other part is interposed therebetween.

In the present specification, the term "Group" refers to a group on the IUPAC Periodic Table of Elements.

In the present specification, the term "alkali metal" refers to a Group 1 element.

In the present specification, the term "halogen" refers to a Group 17 element. If a stated compound or precursor include two or more halogen atoms, e.g., $BX_2$ or $ABX_3$, where X is a halogen, then each X in the compound or precursor can be the same or different.

In the present specification, the term "maximum emission wavelength" refers to a wavelength value of a point having a maximum emission intensity in a photoluminescence (PL) spectrum obtained for a sample after preparing a solution or film sample including a compound.

In the present specification, "full width at half maximum (FWHM)" refers to a wavelength width of a point corresponding to ½ of the maximum emission intensity in the aforementioned PL spectrum.

The term "solubility" refers an amount of compound or precursor in grams that can dissolve completely into a stated volume or mass (grams) of solvent. The solubility is determined by a method well known to those of ordinary skill in the art. If comparing a difference in solubility of a compound D in a solvent S1 verses solvent S2, visible observation is generally sufficient. If necessary, an optical measurement can confirm any difference in the solubility of a compound D in a solvent S1 verses a solvent S2.

Hereinafter, a light-emitting material, a method of manufacturing the light-emitting material, and a light-emitting device including the light-emitting material will be described in detail with reference to the accompanied drawings.

Method of Preparing Light-Emitting Material

According to one or more embodiments, a method of preparing a light-emitting material may include: mixing a first precursor solution including a first precursor and a first solvent with a second precursor solution including a second precursor and a second solvent to form a precipitate; and separating, and optionally drying and/or washing, the precipitate to obtain the light-emitting material, wherein a solubility of the first precursor in the first solvent may be greater than a solubility of the first precursor in the second solvent, and a solubility of the second precursor in the second solvent may be greater than a solubility of the second precursor in the first solvent.

In some embodiments, the first solvent may be different from the second solvent. In some embodiments, as the first solvent may be different from the second solvent, a solubility of the first precursor in the first and second solvents and a solubility of the second precursor in the first and second solvents may be different from each other.

In an embodiment, the first precursor is soluble in the first solvent. As the first precursor is soluble in the first solvent, a first precursor solution may have a relatively high concentration. Accordingly, when the light-emitting material is prepared in a large amount, the amount of the first solvent used may be reduced. In some embodiments, 1 gram (g) or more of the first precursor may be dissolved at a temperature of 25° C. under 1 atmosphere, based on 100 g of the first solvent. In some embodiments, a concentration of the first precursor solution may be 1 molar (M) or greater at a temperature of 25° C. under 1 atmosphere or in a range of about 1 M to about 10 M at a temperature of 25° C. under 1 atmosphere.

In embodiment, the second precursor is soluble in the second solvent. As the second precursor is soluble in the second solvent, a second precursor solution may have a relatively high concentration. Accordingly, when the light-emitting material is prepared in a large amount, the amount of the second solvent used may be reduced. In some embodiments, 1 g or more of the second precursor may be dissolved at a temperature of 25° C. under 1 atmosphere, based on 100 g of the second solvent. In some embodiments, a concentration of the second precursor solution may be 1 molar (M) or greater at a temperature of 25° C. under 1 atmosphere, 1 M or greater at a temperature of 80° C. under 1 atmosphere, or in a range of about 1 M to about 2 M at a temperature of 80° C. under 1 atmosphere.

In some embodiments, the first solvent may include water. In some embodiments, the first solvent may consist of water.

In some embodiments, the second solvent may include hexamethyl phosphoramide (HMPA). In some embodiments, the second solvent may consist of HMPA.

According to one or more embodiments, the first precursor solution and the second precursor solution may each not include an acid. In general, an inorganic acid such as HBr or an organic acid such as an oleic acid may be used to increase a solubility of a light-emitting material precursor. However, in the method of preparing the light-emitting material, even without including an acid, the first precursor may be dissolved in the first solvent in a relatively high concentration, and the second precursor may be dissolved in the second solvent in a relatively high concentration.

According to one or more embodiments, the first precursor solution and the second precursor solution may each not include a base. In the method of preparing the light-emitting material, even without including a base, the first precursor may be dissolved in the first solvent in a relatively high concentration, and the second precursor may be dissolved in the second solvent.

In an embodiment, the manner of forming a precipitate may be performed by adding dropwise the first precursor solution to a stirred second precursor solution. Accordingly, when adding dropwise the first precursor solution to the second precursor solution while stirring the second precursor solution, the precipitate may be formed.

Likewise, in an embodiment, the manner of forming a precipitate may be performed by adding dropwise the second precursor solution to a stirred first precursor solution. Accordingly, when adding dropwise the second precursor solution to the first precursor solution while stirring the first precursor solution, the precipitate may be formed.

The forming of a precipitate may be performed at a temperature lower than a boiling point of the first precursor solution or the second precursor solution. In some embodiments, the forming of a precipitate may be performed in a temperature range of about 20° C. to about 90° C. or about 50° C. to about 80° C.

In some embodiments, the first precursor may include a compound represented by Formula 1:

$$A^1X^1 \qquad \text{Formula 1}$$

wherein, in Formula 1, $A^1$ may be an alkali metal, and $X^1$ may be halogen.

In some embodiments, the second precursor may include a compound represented by Formula 2:

$$B^2(X^2)_2 \qquad \text{Formula 2}$$

wherein, in Formula 2, $B^2$ may be Pb or Sn, and each $X^2$ independently may be halogen.

For example, in Formulae 1 and 2, $A^1$ may be Cs, $B^2$ may be Pb, and $X^1$ and each $X^2$ may independently be Cl, Br, or I.

In some embodiments, in Formulae 1 and 2, a case where $X^1$ and $X^2$ may each be I may be excluded. When one of $X^1$ or $X^2$ are I, or both $X^1$ and $X^2$ are I, stability of the prepared light-emitting material may be low, the light-emitting material may not be obtained in a desired level of a yield.

In some embodiments, the first precursor may include CsCl, CsBr, or a combination thereof.

In some embodiments, the second precursor may include $PbCl_2$, $PbBr_2$, or a combination thereof.

According to one or more embodiments, the first precursor may further include CsI, or the second precursor may further include $PbI_2$, or the first precursor may further include CsI, and the second precursor may further include $PbI_2$.

According to one or more embodiments, a molar ratio of the first precursor:second precursor may be in a range of about 0.5:1 to about 5.0:1. If the molar ratio is satisfied, the light-emitting material having a desired composition may be obtained.

In some embodiments, the light-emitting material may be poorly soluble or insoluble in the first solvent or the second solvent, and thus, the light-emitting material may be obtained in an increased yield. In addition, as the light-emitting material may be poorly soluble or insoluble in the first solvent or the second solvent, a precipitate may form, and the precipitate may be formed relative easily, and separated, e.g., with a filter, and in a manner applicable or more suitable to mass production. In some embodiments, 0.1 g or less of the light-emitting material may be dissolved at a temperature of 25° C. under 1 atmosphere, based on 100 g of the first solvent, and 0.1 g or less of the light-emitting material may be dissolved at a temperature of 25° C. under 1 atmosphere, based on 100 g of the first solvent.

According to one or more embodiments, the light-emitting material may include a compound represented by any one of Formulae 3 to 5:

$$A^3B^3X^3_3 \qquad \text{Formula 3}$$

$$A^4B^4_2X^4_5 \qquad \text{Formula 4}$$

$$A^5_4B^5X^5_6 \qquad \text{Formula 5}$$

wherein, in Formulae 3 to 5, $A^3$, $A^4$, and each $A^5$ may be independently at least one alkali metal, $B^3$, each $B^4$, and $B^5$ may be independently be Pb, Sn, or a combination thereof, and each of $X^3$, $X^4$, and $X^5$ may be independently a halogen.

In some embodiments, the light-emitting material i) may include the light-emitting compound represented by Formula 3 and the light-emitting compound represented by Formula 4, and may not include the light-emitting compound represented by Formula 5; ii) may include the light-emitting compound represented by Formula 3 and the light-emitting compound represented by Formula 5, and may not include the light-emitting compound represented by Formula 4; or iii) may include the light-emitting compound represented by Formula 5, and may not include the light-emitting compound represented by Formula 3 and the light-emitting compound represented by Formula 4.

According to one or more embodiments, a molar ratio of the first precursor:second precursor may be in a range of about 1:1 to about 1.5:1, and the light-emitting material may include the light-emitting compound represented by Formula 3 and the light-emitting compound represented by Formula 4, and may not include the light-emitting compound represented by Formula 5.

According to one or more embodiments, a molar ratio of the first precursor:second precursor may be in a range of about 1.5:1 to about 4.0:1, and the light-emitting material may include the light-emitting compound represented by Formula 3 and the light-emitting compound represented by Formula 5, and may not include the light-emitting compound represented by Formula 4.

According to one or more embodiments, a molar ratio of the first precursor:second precursor may be in a range of about 4.0:1 to about 5.0:1, and the light-emitting material may include the light-emitting compound represented by Formula 5, and may not include the light-emitting compound represented by Formula 3 and the light-emitting compound represented by Formula 4.

In some embodiments, following separation of the precipitate, the method may further include an optional washing of the precipitate, and/or an optional drying of the separated precipitate. In some embodiments, the method may further include washing with ethanol and/or diethyl ether after separating the precipitate. The first precursor and/or the second precursor remaining in the formed precipitate may be removed by washing. Accordingly, the light-emitting material may have an increased purity.

In some embodiments, the drying may be performed in a temperature range of about 40° C. to about 80° C. In some embodiments, the drying may be performed in a temperature of 60° C.

In some embodiments, the drying may be performed in a vacuum atmosphere.

In some embodiments, the drying may be performed for 10 hours or longer, or for example, 12 hours or longer.

According to one or more embodiments, the method of preparing the light-emitting material may further include providing a mixture including the light-emitting material and a third solvent onto a substrate, providing a fourth solvent onto the substrate to achieve crystallization, and heat-treating the substrate to remove the third solvent and the fourth solvent.

Accordingly, depending on the composition of the light-emitting material, a substrate, on which a 2D tetragonal light-emitting material, a 3D cubic light-emitting material, or a OD (non-dimensional) tetragonal light-emitting material may be formed, may be prepared. In some embodiments, a substrate, on which a 3D cubic light-emitting material may be formed, may be prepared.

In some embodiments, the mixture may be spin-coated on a substrate. When the mixture is provided by spin-coating, the spin-coating conditions may be selected from, e.g., a coating rate of about 300 revolutions per minute (rpm) to about 4,000 rpm and a temperature range of about 80° C. to about 200° C., depending on the composition of the mixture. In some embodiments, the coating rate may be controlled depending on a section of the substrate. For example, the coating rate may be maintained in a range of about 300 rpm to about 700 rpm in a first section and in a range of about 2,000 rpm to about 4,000 rpm in a second section.

The mixture may be provided on a substrate by applying various known methods.

In some embodiments, when the mixture is provided by spin-coating, the mixture may be first spin-coated on the substrate, and then an antisolvent may be added to the coated substrate by dropwise adding or spraying while rotating the substrate.

In some embodiments, the third solvent may be dimethyl formamide, dimethyl sulfoxide, γ-butyrolactone, N-methyl-2-pyrrolidone, or a combination thereof, and the fourth solvent may be diethyl ether, toluene, α-terpineol, hexyl carbitol, ethyl acetate, butyl carbitol acetate, hexyl cellosolve, butyl cellosolve acetate, or a combination thereof.

In some embodiments, the third solvent may be dimethyl sulfoxide, and the fourth solvent may be diethyl ether, toluene, ethyl acetate, or a combination thereof.

Subsequently, the third solvent and the fourth solvent may be removed therefrom by heat-treating.

In some embodiments, the heat-treating condition may be selected from a time range from about 15 minutes to about 2 hours and a temperature range from about 50° C. to about 100° C., depending on the composition of the mixture.

According to one or more embodiments, the method of preparing the light-emitting material may further include heat-treating a mixture including the light-emitting material and a third solvent. The third solvent and the heat-treating may respectively be understood by referring to the descriptions of the third solvent and the heat-treating provided herein.

Light-Emitting Material

According to one or more embodiments, a light-emitting material may be prepared by the described method of preparing the light-emitting material.

In some embodiments, the light-emitting material may be represented by at least one of Formula 3, Formula 4, or Formula 5. Formulae 3 to 5 may respectively be understood by referring to the descriptions of Formulae 3 to 5 provided herein.

In some embodiments, the light-emitting material may include the first solvent and/or the second solvent in a very small amount. In some embodiments, the light-emitting material may include the first solvent and/or the second solvent in an amount of 0.01 percent by weight (wt %) or lower.

The light-emitting compound may emit green light.

A maximum emission wavelength (experimental value) of the light-emitting material may be about 500 nanometers (nm) or longer and about 550 nm or shorter, or for example, about 500 nm or longer and about 530 nm or shorter.

A full width at half maximum (FWHM) of the light-emitting material may be 70 nm or less. In some embodiments, a FWHM of the light-emitting material may be 30 nm or less, or for example, 20 nm or less.

The light-emitting material may have a relatively high stability.

Light-Emitting Device

According to an embodiment, a light-emitting device 1 may include: a first electrode 110; a second electrode 190 each having a surface opposite the other; and an emission layer 150 positioned between the first electrode 110 and the second electrode 190, wherein the emission layer 150 may include the light-emitting material.

The structure of the light-emitting device 1 will be described in detail with reference to FIG. 1. FIG. 1 is a schematic cross-sectional view of the light-emitting device 1 according to an embodiment.

Although it is not shown in FIG. 1, a substrate may be further disposed under the first electrode 110 (opposite the emission layer 150) and/or on the second electrode 190 (opposite the emission layer 150). The substrate may be a conventional substrate used in light-emitting devices, e.g., a glass substrate or a transparent plastic substrate, each having excellent mechanical strength, thermal stability, transparency, surface smoothness, ease of handling, and water repellency.

The first electrode 110 may be an anode to which (+) voltage is applied, and the second electrode 190 may be a cathode to which (−) voltage is applied. In contrast, the first electrode 110 may be a cathode, and the second electrode 190 may be an anode. For convenience of description, the case where the first electrode 110 is an anode, and the second electrode 190 is a cathode will be described.

The first electrode 110 may be formed by depositing or sputtering, onto the substrate a material for forming the first electrode 110. The first electrode 110 may be a reflective electrode, a semi-transmissive electrode, or a transmissive electrode. In some embodiments, to obtain a bottom emission light-emitting device, the first electrode 110 may be a semi-transmissive electrode or a transmissive electrode. In some embodiments, to obtain a top emission light-emitting device, the first electrode 110 may be a reflective electrode, and such a variation may be made. The first electrode 110 may have a single-layered structure or a multi-layered structure including a plurality of layers.

The first electrode 110 may include a material with a high work function for easy hole injection. In some embodiments, the material for forming the first electrode 110 may be indium tin oxide (ITO), indium zinc oxide (IZO), indium oxide, tin oxide ($SnO_2$), zinc oxide (ZnO), gallium oxide, or a combination thereof. In some embodiments, the material for forming the first electrode 110 may be a metal, such as magnesium (Mg), aluminum (Al), aluminum-lithium (Al—Li), calcium (Ca), magnesium-indium (Mg—In), magnesium-silver (Mg—Ag), or a combination thereof.

The second electrode 190 may be disposed with a surface opposite the first electrode 110. The second electrode 190 may be a reflective electrode, a semi-transmissive electrode, or a transmissive electrode. In some embodiments, to obtain a bottom emission light-emitting device, the second electrode 190 may be a reflective electrode. In some embodiments, to obtain a top emission light-emitting device, the second electrode 190 may be a semi-transmissive electrode or a transmissive electrode, and such a variation may be made. The second electrode 190 may have a single-layered structure or a multi-layered structure including a plurality of layers.

The second electrode 190 may include a metal, alloy, an electrically conductive compound, or a combination thereof with a relatively low work function. In some embodiments, a material for forming the second electrode 190 may be lithium (Li), magnesium (Mg), aluminum (Al), aluminum-lithium (Al—Li), calcium (Ca), gallium (Ga), magnesium-indium (Mg—In), magnesium-silver (Mg—Ag), or a combination thereof. In some embodiments, the material for forming the second electrode 190 may include ITO, IZO, or a combination thereof.

The emission layer 150 may include the aforementioned light-emitting material. In the emission layer 150, electrons and holes transferred by the voltage supplied by the first electrode 110 and the second electrode 190 may be combined. The electrons and holes are combined to generate excitons, and then the excitons transit from an excited state to a ground state to thereby generate light. The light-emitting device may have high color purity, high current efficiency, and high quantum yield by including the light-emitting material as described above.

The light-emitting material may be understood by referring to the description of the light-emitting material provided herein.

The light-emitting material may be present in the emission layer as a homogeneous or relatively uniform concentration across a thickness direction of the layer, or the light-emitting material may be present as a constant or variable concentration gradient in the emission layer.

If the light-emitting device is a full-color light-emitting device, individual sub-pixels may include emission layers emitting different colors.

In some embodiments, the emission layer may be patterned into a first color emission layer, a second color emission layer, and a third color emission layer, according to a sub-pixel. In this embodiment, at least one emission layer among the foregoing emission layers may necessarily include the light-emitting material. In some embodiments, the first color emission layer may be an emission layer including the light-emitting material, and the second color emission layer and the third color emission layer may be emission layers including different fluorescent or phosphorescent materials or compounds. In this embodiment, the first color emission, the second color emission, and the third color emission may be different from one another, and in some embodiments, the first color to the third color may each have different maximum emission wavelengths. The first color emission to the third color emission may be combined to provide white light, e.g., each of the respective emission layers can be positioned as a stacked structure.

In some embodiments, the emission layer may further include a fourth color emission layer, at least one emission layer of the first color to the fourth color emission layers may be an emission layer including the light-emitting material, and the other emission layers may be emission layers each including different fluorescent or phosphorescent compounds. Such a variation may be made. In this embodiment, the first color to the fourth color may be different from one another, and in some embodiments, the first color to the fourth color may each have different maximum emission wavelengths. The first color to the fourth color may be combined to be white light.

In some embodiments, the light-emitting device may have a structure in which at least two emission layers each emitting different colors may be in contact with or spaced apart from each other. At least one emission layer of the at least two emission layers may be an emission layer including the light-emitting material, and the other emission layer may be emission layer including fluorescent or phosphorescent compounds. Such a variation may be made.

The emission layer 150 may further include, in addition to the light-emitting material, at least one of an organic compound, another inorganic compound, an organic-inorganic composite compound, or quantum dots, but embodiments are not limited thereto.

The thickness of the emission layer 150 may be in a range of about 10 nanometers (nm) to about 200 nm, for example, about 50 nm to about 100 nm. When the thickness of the emission layer 150 is within any of these ranges, improved luminescence characteristics may be obtained without a substantial increase in driving voltage.

An additional layer may be further included between the first electrode 110 and the emission layer 150 and/or between the second electrode 190 and the emission layer 150 to improve device characteristics such as luminescence efficiency by adjusting the charge carrier balance inside the device. In some embodiments, a hole transport region may be further included between the first electrode 110 and the emission layer 150, and an electron transport region may be further included between the second electrode 190 and the emission layer 150.

The hole transport region may serve to inject and/or transport holes from the first electrode 110 to the emission layer 150. In addition, the hole transport region may also compensate for an optical resonance distance depending on a wavelength of light emitted from the emission layer to improve the efficiency of an organic light-emitting device.

The hole transport region may include at least one selected from a hole injection layer, a hole transport layer, and a charge control layer. The hole transport region may be a single layer or a multi-layered structure including at least two layers. In some embodiments, the hole transport region may include a hole injection layer only or a hole transport layer only. In some embodiments, the hole transport region may include a hole injection layer and a hole transport layer which are sequentially stacked on the first electrode 110. In some embodiments, the hole transport region may include a hole injection layer, a hole transport layer, and a hole control layer, which are sequentially stacked on the first electrode 110.

In some embodiments, the hole transport region may include, for example, 1,3-bis(9-carbazolyl)benzene (mCP), 4,4'-bis(N-carbazolyl)-1,1'-biphenyl (CBP), 3,3-bis(carbazol-9-yl)biphenyl (mCBP), 4,4',4''-tris[phenyl(m-tolyl)amino]triphenylamine (m-MTDATA), TDATA, 2-TNATA, N,N'-di(1-naphthyl)-N,N'-diphenyl-(1,1'-biphenyl)-4,4'-diamine (NPB), β-NPB, N,N'-bis(3-methylphenyl)-N,N'-diphenylbenzidine (TPD), spiro-TPD, spiro-NPB, methylated-NPB, TAPC, HMTPD, tris(4-carbazoyl-9-ylphenyl)amine (TCTA), polyaniline/dodecylbenzenesulfonic acid (PANI/DBSA), poly(3,4-ethylenedioxythiophene)/poly(4-styrene sulfonate) (PEDOT/PSS), poly(9,9-dioctyl-fluorene-co-N-(4-butylphenyl)-diphenylamine) (TFB), polyarylamine, poly(N-vinylcarbazole) (PVK), polypyrrole, polyaniline/camphor sulfonic acid (PANI/CSA), or polyaniline/poly(4-styrenesulfonate) (PANI/PSS), but embodiments are not limited thereto:

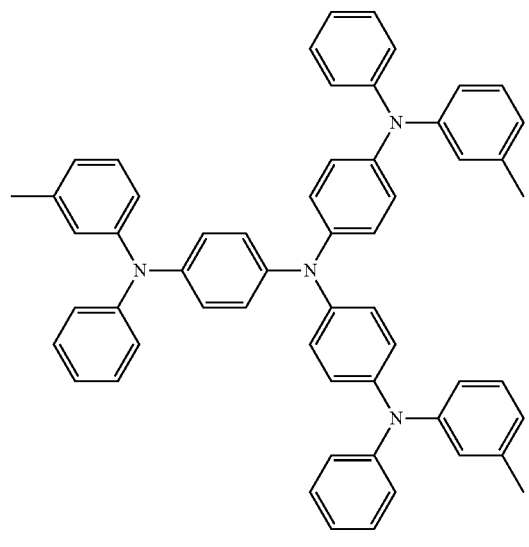

m-MTDATA

-continued
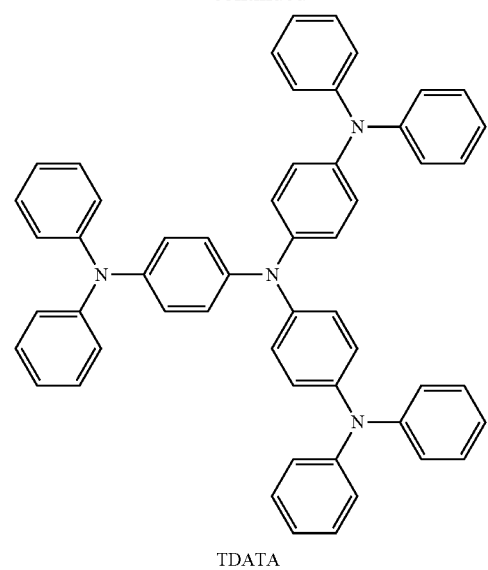
TDATA
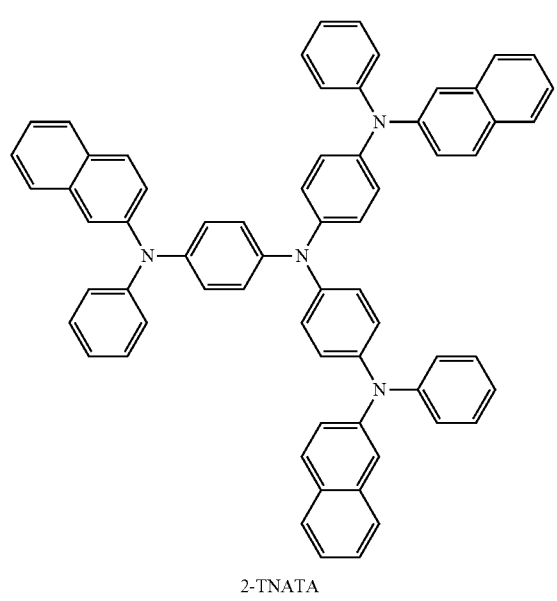
2-TNATA
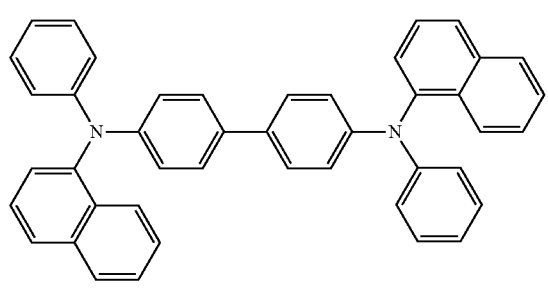
NPB
-continued
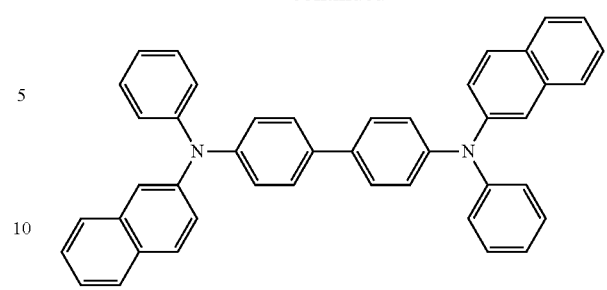
β-NPB
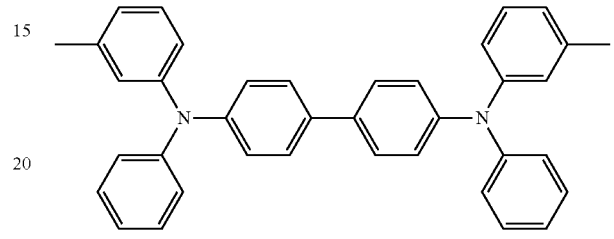
TPD
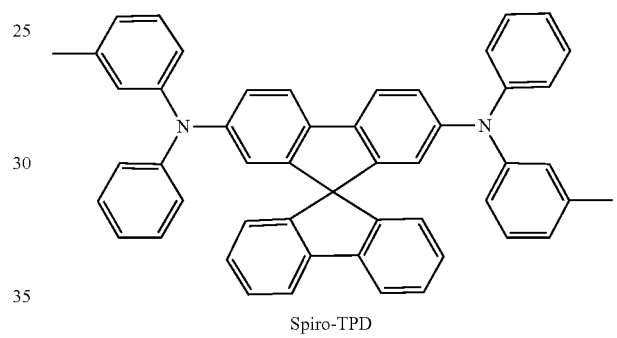
Spiro-TPD
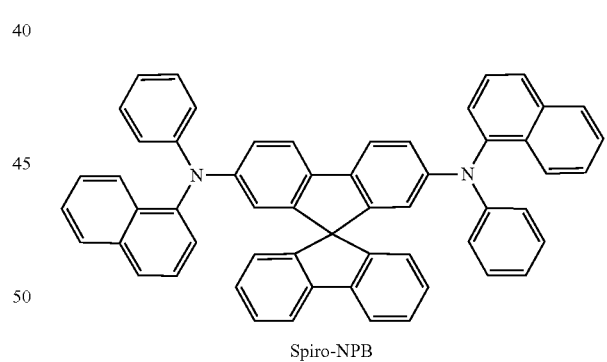
Spiro-NPB
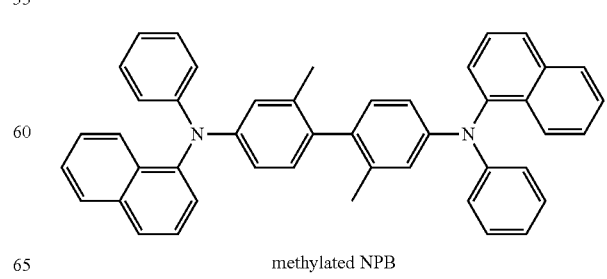
methylated NPB

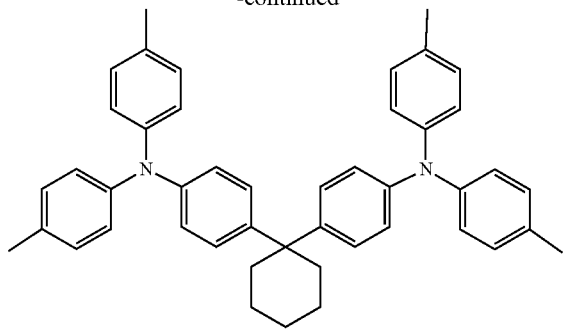

TAPC

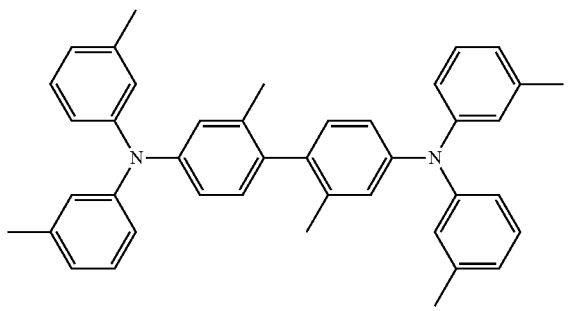

HMTPD

The thickness of the hole transport region may be determined in consideration of the wavelength of light emitted from the emission layer, the driving voltage of the light-emitting device, current efficiency, or the like. In some embodiments, the thickness of the hole transport region may be in a range of about 10 nm to about 1,000 nm, and in some embodiments, in a range of about 10 nm to about 100 nm. When the hole transport region includes the hole injection layer and the hole transport layer, the thickness of the hole injection layer may be in a range of about 10 nm to about 200 nm, and the thickness of the hole transport layer may be in a range of about 5 nm to about 100 nm.

The hole transport region may include a p-dopant as well as the aforementioned materials to improve conductive properties of the hole transport region. The p-dopant may be substantially homogeneously or non-homogeneously dispersed in the hole transport region.

The p-dopant may include one of a quinone derivative, a metal oxide, and a compound containing a cyano group, but embodiments are not limited thereto. For example, non-limiting examples of the p-dopant include a quinone derivative, such as tetracyanoquinodimethane (TCNQ) or 2,3,5,6-tetrafluoro-tetracyano-1,4-benzoquinonedimethane (F4-TCNQ); a metal oxide, such as a tungsten oxide or a molybdenum oxide; and a compound containing a cyano group, such as Compound HAT-CN (dipyrazino[2,3-f:2',3'-h]quinoxaline-2,3,6,7,10,11-hexacarbonitrile), but embodiments are not limited thereto:

The electron transport region may serve to inject and/or transport electrons from the second electrode 190 to the emission layer 150. In addition, the electron transport region may also compensate for an optical resonance distance depending on a wavelength of light emitted from the emission layer to improve the efficiency of an organic light-emitting device.

The electron transport region may include at least one of an electron injection layer, an electron transport layer, or a charge control layer. The electron transport region may be a single layer or a multi-layered structure including at least two layers. In some embodiments, the electron transport region may include an electron injection layer only or an electron transport layer only. In some embodiments, the hole transport region may include a structure of electron transport layer/electron injection layer or charge control layer/electron transport layer/electron injection layer, which are sequentially stacked on the emission layer 150.

The electron transport region may include, for example, at least one of Alq3, bathocuproine (BCP), 4,7-diphenyl-1,10-phenanthroline (Bphen), bis(2-methyl-8-quinolinolato-N1,O8)-(1,1'-biphenyl-4-olato)aluminum (Balq), 3-(biphenyl-4-yl)-5-(4-tert-butylphenyl)-4-phenyl-4H-1,2,4-triazole (TAZ), 4-(naphthalen-1-yl)-3,5-diphenyl-4H-1,2,4-triazole (NTAZ), bis(10-hydroxybenzo[h]quinolinato)beryllium (Bebq2), B3PYMPM, TPBI, 3TPYMB, BmPyPB, TmPyPB, BSFM, PO-T2T, or PO15, but embodiments are not limited thereto. In some embodiments, the electron transport layer and/or the charge control layer may include at least one of the foregoing compounds, but embodiments are not limited thereto.

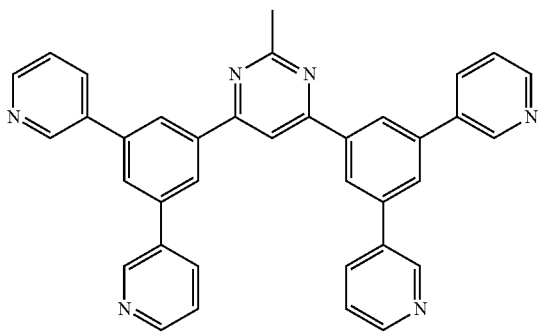

B3PYMPM

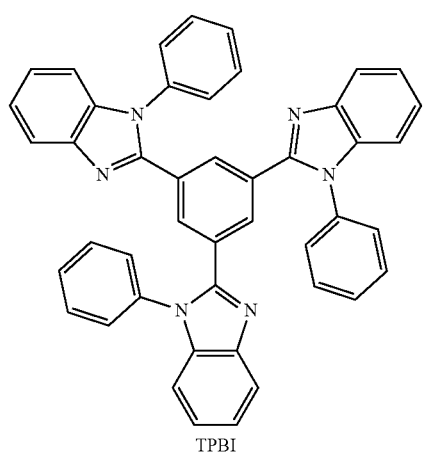

TPBI

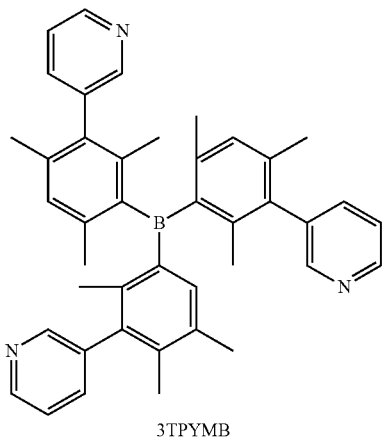
3TPYMB

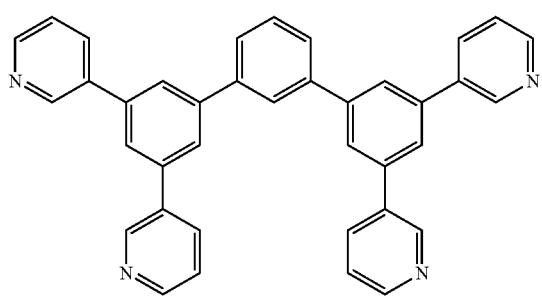
BmPyPB

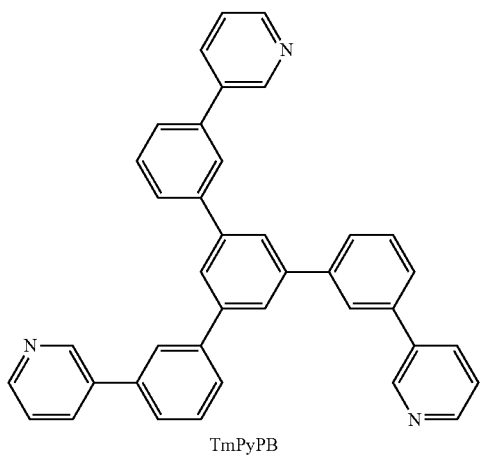
TmPyPB

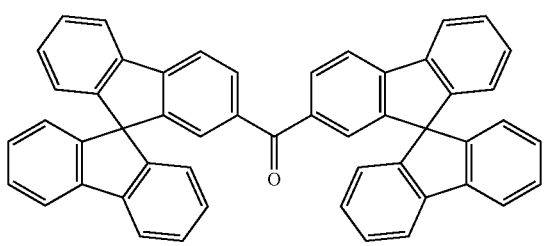
BSFM

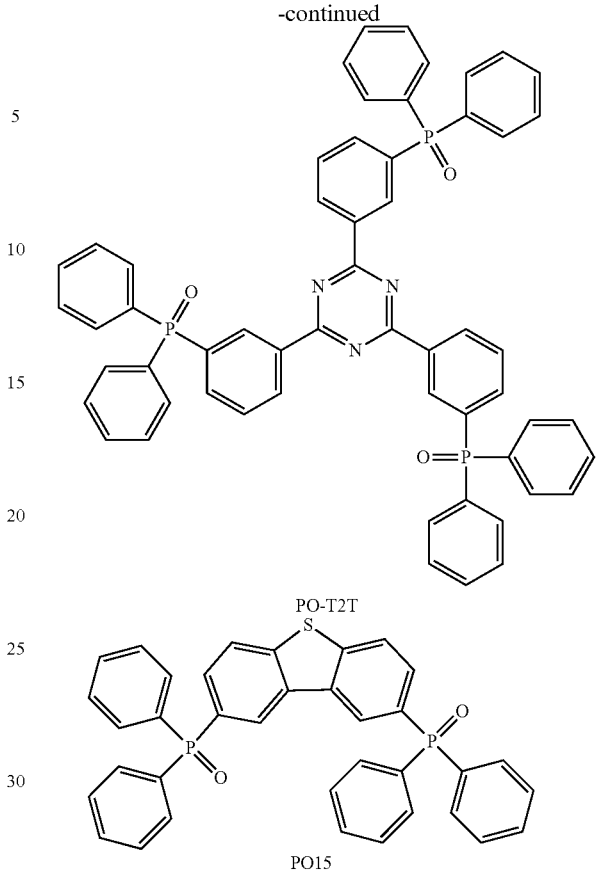
PO-T2T

PO15

In some embodiments, the electron injection layer may include or consist of an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof. In some embodiments, the electron injection layer may further include organic materials described above, but embodiments are not limited thereto.

In some embodiments, the electron injection layer may further include LiF, NaF, CsF, KF, $Li_2O$, $Cs_2O$, $K_2O$, BaO, SrO, CaO, 8-quinolinolato lithium (LiQ), or a combination thereof. In some embodiments, the electron injection layer may further include the foregoing organic compounds, but embodiments are not limited thereto.

The thickness of the electron transport region may be determined in consideration of the wavelength of light emitted from the emission layer, the driving voltage of the light-emitting device, current efficiency, or the like. In some embodiments, the thickness of the electron transport region may be in a range of about 1 nm to about 1,000 nm, and in some embodiments, in a range of about 1 nm to about 200 nm. When the electron transport region includes the electron injection layer and the electron transport layer, the thickness of the electron injection layer may be in a range of about 1 nm to about 50 nm, and the thickness of the electron transport layer may be in a range of about 5 nm to about 100 nm.

The charge control layer may be included to adjust the charge injection balance at an interface between the layer including an organic compound (e.g., a hole transport layer, an electron transport layer, or the like) and the layer including an inorganic compound (e.g., an emission layer). The charge control layer may include a polymeric compound, e.g., poly(methyl methacrylate) (PMMA), polyimide (PI), poly vinyl alcohol (PVA), or a combination or copolymer thereof, but embodiments are not limited thereto. By including the electron control layer, since the charge injection balance of the light-emitting device may be improved, thereby increasing the external quantum yield. In addition, as the electron control layer is directly adjacent to the emission layer, the emission layer may be flat, and the driving voltage of the light-emitting device may be lowered.

According to an embodiment, the light-emitting device may include a hole transport region between the first electrode and the emission layer and/or an electron transport region between the emission layer and the second electrode.

In some embodiments, the light-emitting device may include a charge control layer between the first electrode and the emission layer and/or between the emission layer and the second electrode.

Each layer in the light-emitting device 1 may be formed by various methods, such as vacuum deposition, spin coating, casting, Langmuir-Blodgett (LB) deposition, or the like.

When a hole injection layer is formed by vacuum-deposition, for example, the vacuum deposition may be performed at a temperature in a range of about 100° C. to about 500° C., at a vacuum degree in a range of about $10^{-8}$ torr to about $10^{-3}$ torr, and at a rate in a range of about 0.01 Angstroms per second (Å/sec) to about 100 Å/sec, though the conditions may vary depending on a compound used as a hole injection material and a structure and thermal properties of a desired hole injection layer, but embodiments are not limited thereto.

When a hole injection layer is formed by spin coating, the spin coating may be performed at a rate in a range of about 2,000 revolutions per minute (rpm) to about 5,000 rpm and at a temperature in a range of about 80° C. to 200° C. to facilitate removal of a solvent after the spin coating, though the conditions may vary depending on a compound used as a hole injection material and a structure and thermal properties of a desired hole injection layer, but embodiments are not limited thereto.

Hereinbefore, the light-emitting device has been described with reference to FIG. 1, but is not limited thereto.

Hereinafter, the light-emitting material according to an embodiment, a method of preparing the light-emitting material, and a light-emitting device including the light-emitting material will be described in more detail with reference to Synthesis Examples and Examples; however, embodiments are not limited thereto. The wording "B was used instead of A" used in describing Synthesis Examples means that an identical molar equivalent of B was used in place of A.

Examples

Analysis Method (1) Measurement of Photoluminescence (PL) Spectrum

A light-emitting compound was coated on a glass substrate to form a film having a thickness of in a range of 200 nm to 400 nm. A PL spectrum of the film was measured using an ISC PC1 spectrofluorometer at room temperature by excitation under nitrogen atmosphere with excitation light having a wavelength of 400 nm.

(2) Measurement of Photoluminescent Quantum Yield (PLQY)

A light-emitting material was coated on a glass substrate to form a film having a thickness of in a range of 200 nm to 400 nm. A PLQY of the film was measured using C9920-2-12 and PMA-11 (Hamamatsu Photonics) by excitation under nitrogen atmosphere with excitation light having a wavelength of 400 nm.

(3) X-Ray Diffraction (XRD) Analysis

A sample was analyzed using Philips Analytical X'Pert PRO X-ray Diffraction System (Cu target) at a scanning rate of 4° per minute in an angle range of 10° to 50°.

Synthesis Example 1

2.128 grams (g) (10 millimole (mmol)) of CsBr as a first precursor was dissolved in 10 milliliters (mL) of deionized water at room temperature to prepare a first precursor solution. 3.670 g (10 mmol) of $PbBr_2$ as a second precursor was dissolved in 10 mL of hexamethyl phosphoramide (HMPA) at a temperature of 80° C. to prepare a second precursor solution that is then allowed to cool to room temperature. The first precursor solution was added dropwise to the second precursor solution at room temperature while stirring the second solution. During the addition a precipitate appears. The resulting precipitate is separated from the mixed solution and washed with 1×20 mL of ethanol followed by 1×20 mL of diethyl ether. The resulting solid was dried in vacuum at a temperature of 60° C. for 12 hours to obtain 4.81 g of a light-emitting material of Example 1-1 (preparation yield: 83%). Light-emitting materials of Examples 1-2 to 1-5 were prepared in substantially the same manner as in Example 1-1, except that a concentration of the first precursor solution, a concentration of the second precursor solution, and a molar ratio of the first precursor to the second precursor were changed as indicated in Table 1. XRD analysis was performed on the light-emitting materials of Examples 1-1 to 1-5. The results of which are shown in FIG. 2.

TABLE 1

| Light-emitting material | First precursor | First precursor content; and [solution volume] | Second precursor | Second precursor content; and [solution volume] | Molar ratio of first precursor:second precursor | Yield (%) |
|---|---|---|---|---|---|---|
| Ex. 1-1 | CsBr | 10 mmol, [10 mL] | $PbBr_2$ | 10 mmol, [10 mL] | 1.0:1.0 | 83 |
| Ex. 1-2 | CsBr | 11 mmol, [10 mL] | $PbBr_2$ | 10 mmol, [10 mL] | 1.1:1.0 | 85 |
| Ex. 1-3 | CsBr | 30 mmol, [10 mL] | $PbBr_2$ | 10 mmol, [10 mL] | 3.0:1.0 | 88 |
| Ex. 1-4 | CsBr | 40 mmol, [10 mL] | $PbBr_2$ | 10 mmol, [10 mL] | 4.0:1.0 | 92 |
| Ex. 1-5 | CsBr | 50 mmol, [10 mL] | $PbBr_2$ | 10 mmol, [10 mL] | 5.0:1.0 | 94 |

Figure 2:
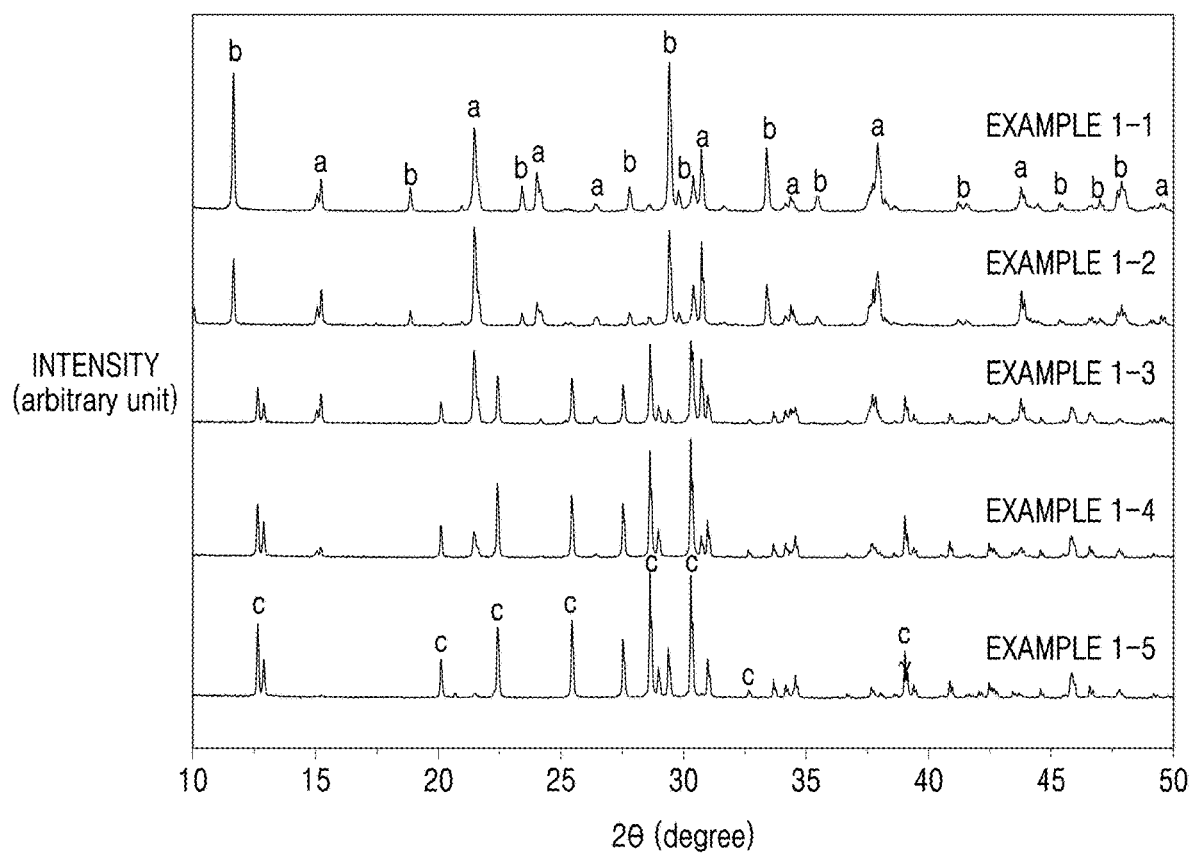
FIG. 2 is an X-ray diffractometry (XRD) analysis of Examples 1-1 to 1-5.

As shown in FIG. 2, depending on the molar ratio of the first precursor to the second precursor, light-emitting materials were obtained as a mixture of $CsPbBr_3$ (peaks a), $CsPb_2Br_5$ (peaks b), and/or $Cs_4PbBr_6$ (peaks c).

Synthesis Example 2

Figure 3A:
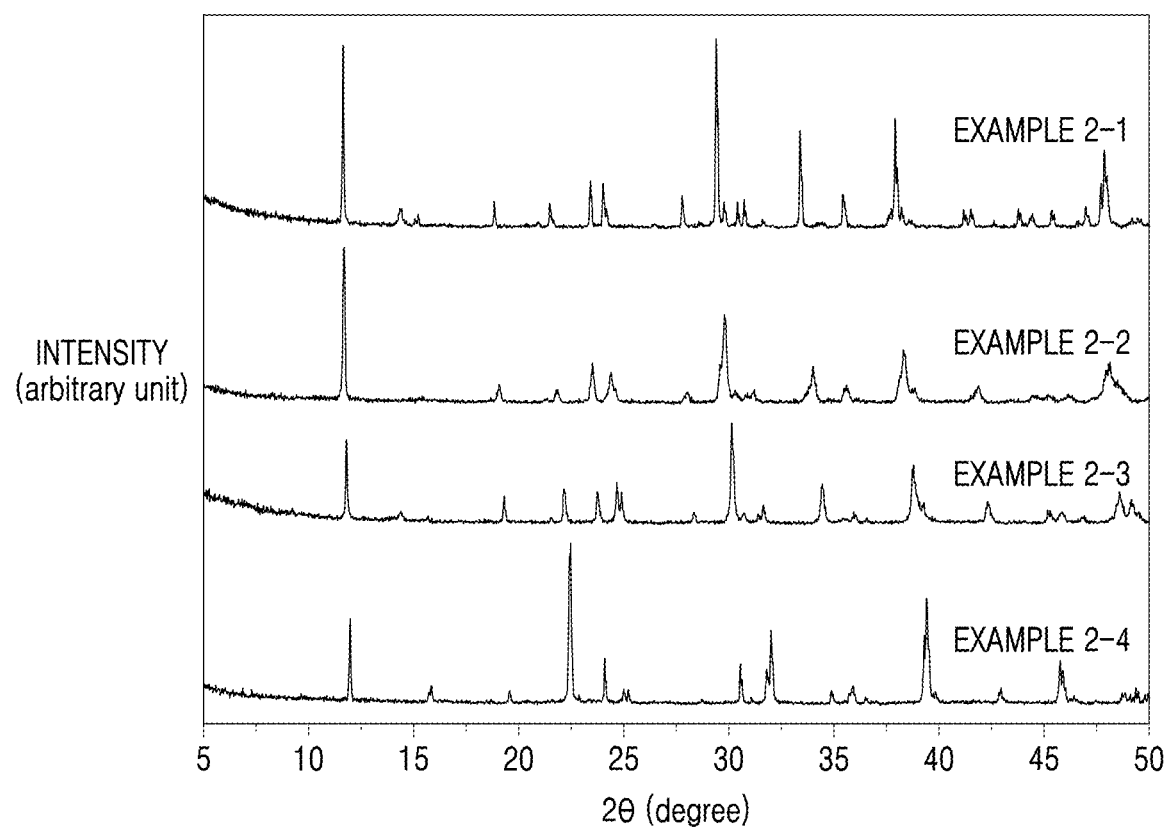
FIG. 3A is an XRD analysis of Examples 2-1 to 2-4.
Figure 3B:
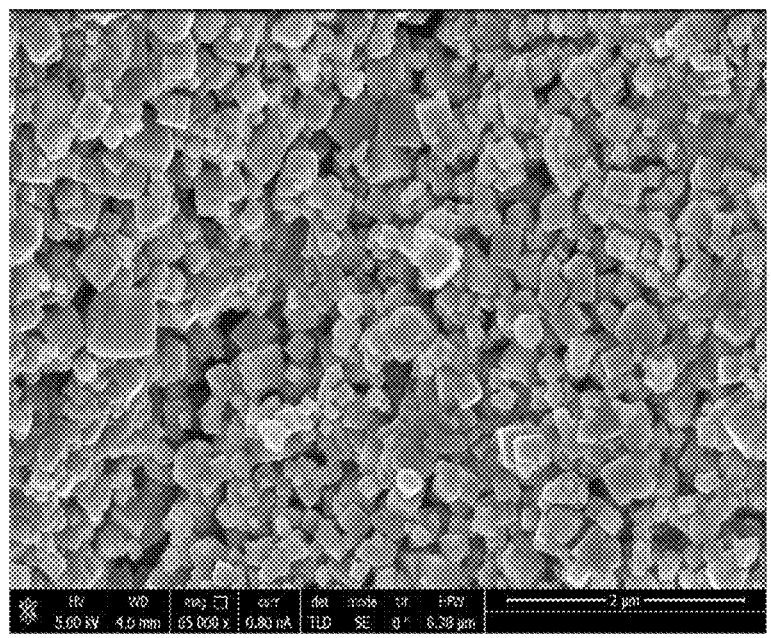
FIG. 3B is a scanning electron microscope (SEM) image of Example 2-4.

2.341 g (11 mmol) of CsBr as a first precursor was dissolved in 10 mL of deionized water at room temperature to prepare a first precursor solution. 3.670 g (10 mmol) of $PbBr_2$ as a second precursor was dissolved in 10 mL of HMPA at a temperature of 80° C. to prepare a second precursor solution that is then allowed to cool to room temperature. The first precursor solution was added dropwise to the second precursor solution at room temperature while stirring the second solution. During the addition a precipitate appears. The resulting precipitate is separated from the mixed solution and washed with 1×20 mL of ethanol and 1×20 mL of diethyl ether. The resulting solid was dried in vacuum at a temperature of 60° C. for 12 hours to obtain 5.11 g of a light-emitting material of Example 2-1 (preparation yield: 85%). Light-emitting materials of Examples 2-2 to 2-4 were prepared in substantially the same manner as in Example 2-1, except that a concentration of the first precursor solution, a concentration of the second precursor solution, and a molar ratio of the first precursor to the second precursor were changed as indicated in Table 2. XRD analysis was performed on the light-emitting materials of Examples 2-1 to 2-4. The results of which are shown in FIG. 3A. The scanning electron microscope (SEM) image of Example 2-4 is shown in FIG. 3B.

Comparative Thin Film 1

Figure 4A:
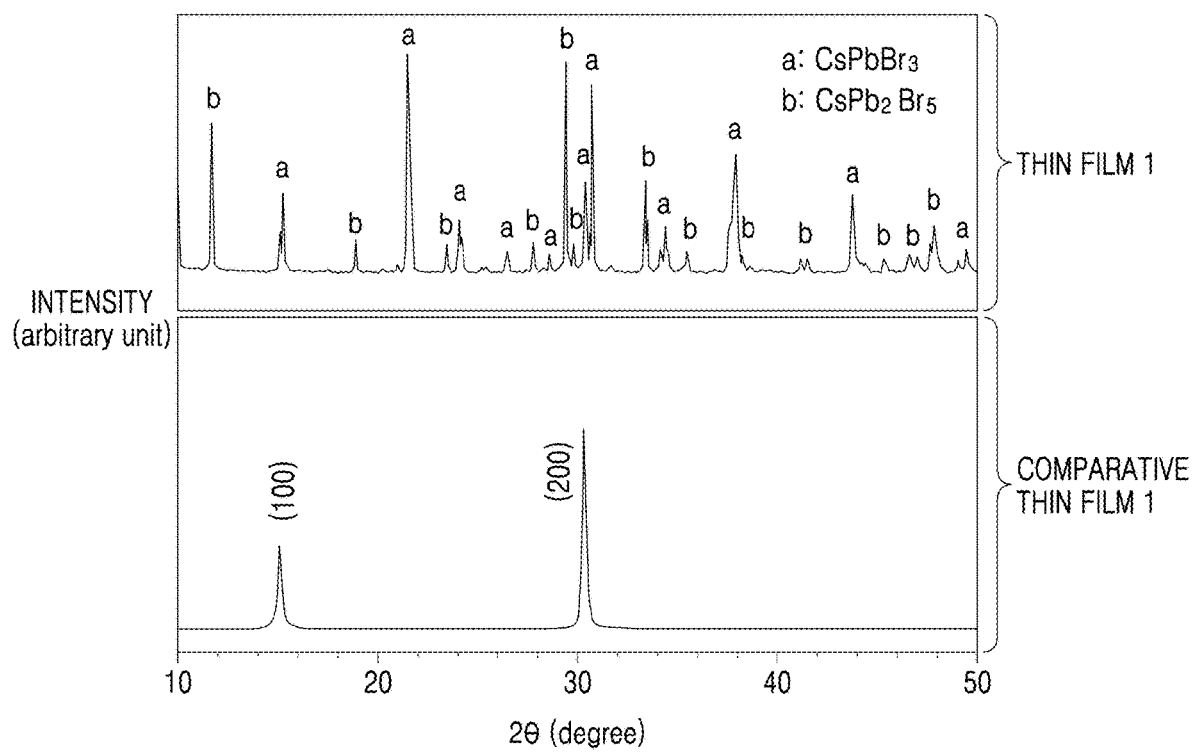
FIG. 4A is an XRD analysis of Thin Film 1 and Comparative Thin Film 1.
Figure 4B:
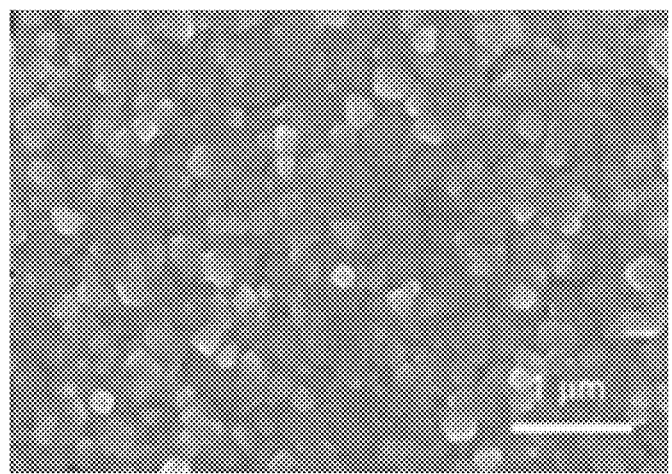
FIG. 4B is an SEM image of Thin Film 1.

A solution, in which CsBr and $PbBr_2$ were dissolved in 1 mL of DMSO at a molar ratio of 1.0:1.0, was spin-coated at a coating rate of 2,000 rpm to 4,000 rpm for 30 seconds. At a time of 50 seconds after starting the spin-coating, diethyl ether was added dropwise thereto at a rate of 2 mL per second for 0.5 seconds. The resulting mixture was heat-treated at a temperature of 60° C. to 80° C. for 10 minutes to form Comparative Thin Film 1 having a thickness of 200 nm. XRD analysis was performed on Thin Film 1 and Comparative Thin Film 1. The results thereof are shown in FIG. 4A. The SEM image of Thin Film 1 is shown in FIG. 4B. As shown in FIG. 4A, Thin Film 1 was found to include cubic $CsPbBr_3$.

Synthesis Example 4: Manufacture of Thin Film 2.128 g (10 mmol) of CsBr as a first precursor was dissolved in 20 mL of deionized water at room temperature to prepare a first precursor solution. 7.340 g (20 mmol) of $PbBr_2$ as a second precursor was dissolved in 20 mL of HMPA at a temperature of 80° C. to prepare a second precursor solution cooled to room temperature. The first precursor solution was added dropwise to the second precursor solution at room temperature while stirring the second solution. During the addition a precipitate appears. The resulting precipitate is separated from the mixed solution and washed with 1×40 mL of ethanol and 1×40 mL of diethyl ether. The resulting solid was dried in vacuum at a temperature of 60° C. for 12 hours to obtain 7.67 g of a light-emitting material of Example 3-1 (preparation yield: 81%). Light-emitting materials of Examples 3-2 and 3-3 were prepared in substantially the same manner as in Example 3-1, except that a concentration of the first precursor solution, a concentration of the second precursor solu-

TABLE 2

| Light-emitting material | First precursor | First precursor content; and [solution volume] | Second precursor | Second precursor content; and [solution volume] | Molar ratio of first precursor:second precursor | Yield |
|---|---|---|---|---|---|---|
| Ex. 2-1 | CsBr | 11 mmol, [10 mL] | $PbBr_2$ | 10 mmol, [10 mL] | 1.1:1.0 | 85 |
| Ex. 2-2 | CsCl | 11 mmol, [10 mL] | $PbBr_2$ | 10 mmol, [10 mL] | 1.1:1.0 | 86 |
| Ex. 2-3 | CsBr | 11 mmol, [10 mL] | $PbCl_2$ | 10 mmol, [10 mL] | 1.1:1.0 | 88 |
| Ex. 2-4 | CsCl | 11 mmol, [10 mL] | $PbCl_2$ | 10 mmol, [10 mL] | 1.1:1.0 | 93 |

As shown in FIGS. 3A and 3B, it was found that a $CsPbCl_3$ light-emitting material may be obtained in substantially the same manner as in Synthesis Example 1.

Synthesis Example 3: Manufacture of Thin Films 0.58 g of the dried solid prepared in Example 1-2 (1 mmol based on $CsPbBr_3$) was dissolved in 1 mL of dimethyl sulfoxide (DMSO). The solution was spin-coated on a glass substrate at a coating rate in a range of 2,000 rpm to 4,000 rpm for 30 seconds. At a time of 50 seconds after starting the spin-coating, diethyl ether was added dropwise to the coated substrate at a rate of 2 mL per second for 0.5 seconds. The resulting mixture was heat-treated at a temperature of 60° C. to 80° C. for 10 minutes to form Thin Film 1 having a thickness of 200 nm of the light-emitting material of Example 1-2.

tion, and a molar ratio of the first precursor to the second precursor were changed as indicated in Table 3.

Subsequently, 0.95 g (1 mmol based on $CsPb_2Br_5$) of the dried solid from Example 3-1 was dissolved in 1 mL of DMSO. The resulting solution was spin-coated on a glass substrate at a coating rate of 500 rpm for 30 seconds and then further spin-coated at a coating rate of 2,000 rpm to 4,000 rpm for 30 seconds. At the time of 50 seconds after starting the spin-coating, diethyl ether was added dropwise to the coated substrate at a rate of 2 mL per second for 0.5 seconds. The resulting mixture was heat-treated at a temperature of 60° C. to 80° C. for 10 minutes to form a glass substrate on which the light-emitting material of Example 3-1 is formed to a thickness of 200 nm. The process was performed in substantially the same manner on glass substrates respectively using the light-emitting material of Example 3-2 or 3-3. The resulting glass substrate underwent an XRD analysis. The results thereof are shown in FIG. 5.

TABLE 3

| Light-emitting material | First precursor | First precursor: content; [solution volume] | Second precursor | Second precursor content; [solution volume] | Molar ratio of first precursor:second precursor | Yield |
|---|---|---|---|---|---|---|
| Ex. 3-1 | CsBr | 10 mmol, [20 mL] | PbBr$_2$ | 20 mmol, [20 mL] | 1.0:2.0 | 81 |
| Ex. 3-2 | CsBr | 11 mmol, [10 mL] | PbBr$_2$ | 10 mmol, [10 mL] | 1.1:1.0 | 85 |
| Ex. 3-3 | CsBr | 15 mmol, [10 mL] | PbBr$_2$ | 10 mmol, [10 mL] | 1.5:1.0 | 88 |

Figure 5:
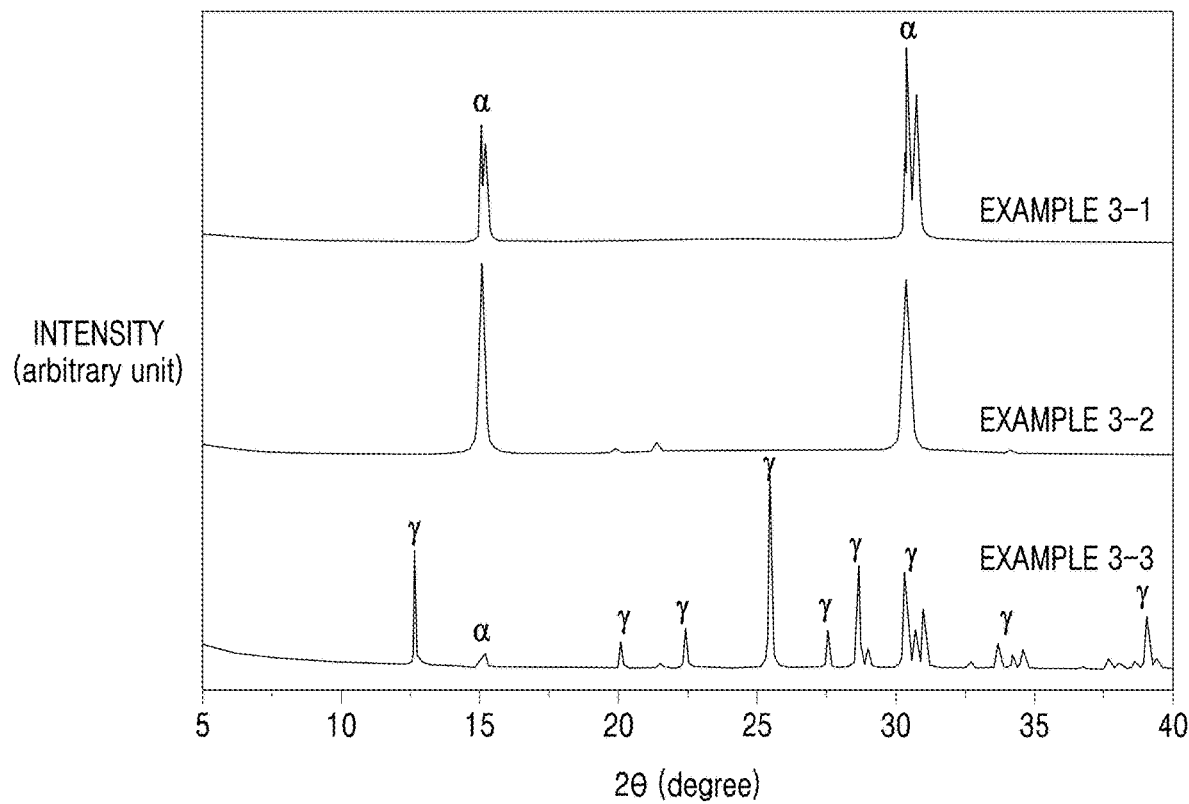
FIG. 5 is an XRD analysis of Examples 3-1 to 3-3.

As shown in FIG. 5, it was found that 2D tetragonal CsPb$_2$Br$_5$ was the major product of the light-emitting material of Example 3-1, 3D cubic CsPbBr$_3$ was the major product of the light-emitting material of Example 3-2, and 0D (non-dimensional) Cs$_4$PbBr$_6$ was the major product of the light-emitting material of Example 3-3.

Synthesis Example 5: Manufacture of Thin Film

Figure 6:
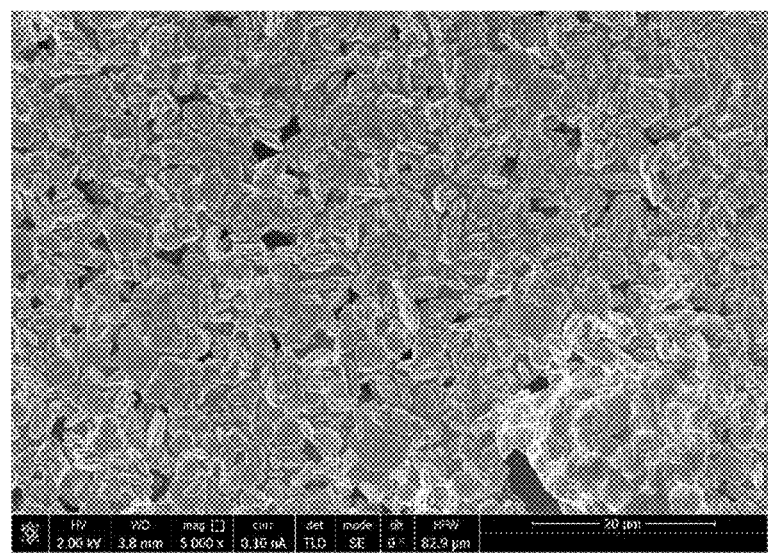
FIG. 6 is an SEM image of a $Cs_4PbBr_6/CsPbBr_3$ complex powder of a light-emitting material of Example 3-3.

A solution, in which the light-emitting material of Example 3-3 was dissolved in 1 molar (M) DMSO solution, was heat-treated at a temperature of 80° C. The heat-treated Cs$_4$PbBr$_6$/CsPbBr$_3$ complex powder was dissolved in DMSO at a concentration of 1 M, and the mixture was spin-coated on a glass substrate to a thickness of 200 nm. The PLQY of the resulting glass substrate was measured to be 80%. As the result of measurement of the PL spectrum, the Cs$_4$PbBr$_6$/CsPbBr$_3$ complex powder was found to have a central wavelength of 517 nm and FWHM of 18 nm. The SEM image of Cs$_4$PbBr$_6$/CsPbBr$_3$ complex powder is shown in FIG. 6.

As apparent from the foregoing description, the method of preparing a light-emitting material enables mass production of the light-emitting material at a low cost. In addition, the light-emitting material prepared by the method described above may have improved luminescence characteristics, e.g., a relatively small FWHM or a relatively high luminescence efficiency. Accordingly, a light-emitting device including the light-emitting material may have improved colorimetric purity and/or efficiency.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:
1. A method of preparing a light-emitting material, the method comprising:
    mixing a first precursor solution comprising a first precursor and a first solvent with a second precursor solution comprising a second precursor and a second solvent to form a precipitate; and
    separating the precipitate to obtain the light-emitting material, wherein the light-emitting material comprises a light-emitting compound represented by at least one of Formula 3, Formula 4, or Formula 5:

$$A^3B^3X^3_3;\qquad\text{Formula 3,}$$

$$A^4B^4_2X^4_5;\qquad\text{Formula 4,}$$

$$A^5_4B^5X^5_6;\qquad\text{Formula 5,}$$

wherein, in Formulae 3, 4, and 5,
    $A^3$, $A^4$, and each $A^5$ are independently an alkali metal,
    $B^3$, $B^4$, and $B^5$ are independently Pb, Sn, or a combination thereof, and
    each of $X^3$, $X^4$, and $X^5$ are independently a halogen;
wherein a solubility of the first precursor in the first solvent is greater than a solubility of the first precursor in the second solvent, and
a solubility of the second precursor in the second solvent is greater than a solubility of the second precursor in the first solvent.

2. The method of claim 1, wherein
    1 gram or more of the first precursor is dissolved at a temperature of 25° C. under 1 atmosphere, based on 100 grams of the first solvent, and
    1 gram or more of the second precursor is dissolved at a temperature of 25° ° C. under 1 atmosphere, based on 100 grams of the second solvent.

3. The method of claim 1, wherein
    a concentration of the first precursor in the first precursor solution is 1 molar or more at a temperature of 25° C. under 1 atmosphere, and
    a concentration of the second precursor in the second precursor solution is 1 molar or more at a temperature of 80° C. under 1 atmosphere.

4. The method of claim 1, wherein
    the first solvent comprises water, and
    the second solvent comprises hexamethyl phosphoramide.

5. The method of claim 1, wherein each of the first precursor solution and the second precursor solution do not comprise an acid or a base.

6. The method of claim 1, wherein the first precursor comprises CsCl, CsBr, or a combination thereof, and the second precursor comprises PbCl$_2$, PbBr$_2$, or a combination thereof.

7. The method of claim 6, wherein the first precursor further comprises CsI, the second precursor further comprises PbI$_2$, or the first precursor further comprises CsI and the second precursor further comprises PbI$_2$.

8. The method of claim 1, wherein a molar ratio of the first precursor:second precursor is in a range of about 0.5:1 to about 5.0:1.

9. The method of claim 1, wherein
    0.1 grams or less of the light-emitting material is dissolved at a temperature of 25° C. under 1 atmosphere, based on 100 grams of the first solvent, and
    0.1 grams or less of the light-emitting material is dissolved at a temperature of 25° C. under 1 atmosphere, based on 100 grams of the second solvent.

10. The method of claim 1, wherein
a molar ratio of the first precursor:second precursor is in a range of about 1:1 to about 1.5:1, and
the light-emitting material comprises the light-emitting compound represented by Formula 3 and the light-emitting compound represented by Formula 4, and does not comprise the light-emitting compound represented by Formula 5.

11. The method of claim 1, wherein
a molar ratio of the first precursor:second precursor is in a range of about 1.5:1 to about 4.0:1, and
the light-emitting material comprises the light-emitting compound represented by Formula 3 and the light-emitting compound represented by Formula 5, and does not comprise the light-emitting compound represented by Formula 4.

12. The method of claim 1, wherein
a molar ratio of the first precursor:second precursor is in a range of about 4.0:1 to about 5.0:1, and
the light-emitting material comprises the light-emitting compound represented by Formula 5, and does not comprise the light-emitting compound represented by Formula 3 or the light-emitting compound represented by Formula 4.

13. The method of claim 1, wherein
the first precursor comprises a compound represented by Formula 1, and the second precursor comprises a compound represented by Formula 2:

$$A^1X^1 \qquad \text{Formula 1}$$

$$B^2(X^2)_2 \qquad \text{Formula 2}$$

wherein, in Formulae 1 and 2,
$A^1$ is an alkali metal,
$B^2$ is Pb or Sn, and
$X^1$ and each $X^2$ are independently a halogen.

14. A method of preparing a light-emitting material, the method comprising:
mixing a first precursor solution comprising a first precursor and a first solvent with a second precursor solution comprising a second precursor and a second solvent to form a precipitate;
wherein the first precursor comprises a compound represented by Formula 1, and the second precursor comprises a compound represented by Formula 2:

$$A^1X^1 \qquad \text{Formula 1}$$

$$B^2(X^2)_2 \qquad \text{Formula 2}$$

wherein, in Formulae 1 and 2,
$A^1$ is an alkali metal,
$B^2$ is Pb or Sn, and
$X^1$ and each $X^2$ are independently a halogen, and
separating the precipitate to obtain the light-emitting material,
wherein a solubility of the first precursor in the first solvent is greater than a solubility of the first precursor in the second solvent, and
a solubility of the second precursor in the second solvent is greater than a solubility of the second precursor in the first solvent.

15. The method of claim 14, wherein
a concentration of the first precursor in the first precursor solution is 1 molar or more at a temperature of 25° C. under 1 atmosphere, and first solvent comprises water; and
a concentration of the second precursor in the second precursor solution is 1 molar or more at a temperature of 80° C. under 1 atmosphere, and the second solvent comprises hexamethyl phosphoramide.

* * * * *